(12) United States Patent
Chen et al.

(10) Patent No.: US 8,329,529 B2
(45) Date of Patent: Dec. 11, 2012

(54) VIA CONTACT STRUCTURES AND METHODS FOR INTEGRATED CIRCUITS

(75) Inventors: Man Hua Chen, Shanghai (CN); Lien Hung Cheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 84 days.

(21) Appl. No.: 12/885,248

(22) Filed: Sep. 17, 2010

(65) Prior Publication Data

US 2011/0074036 A1 Mar. 31, 2011

(30) Foreign Application Priority Data

Sep. 28, 2009 (CN) .......................... 2009 1 0057964

(51) Int. Cl.
*H01L 21/8238* (2006.01)
*H01L 21/336* (2006.01)
*H01L 27/082* (2006.01)
(52) U.S. Cl. ........ 438/200; 438/210; 438/266; 257/574; 257/577; 257/E21.522; 257/E21.575; 257/E21.577
(58) Field of Classification Search .................. 438/200, 438/210, 233, 258, 266, 637; 257/369, 574, 257/577, 618, 621, E21.522, E21.575, E21.577
See application file for complete search history.

(56) References Cited

U.S. PATENT DOCUMENTS

| | | | | |
|---|---|---|---|---|
| 6,440,753 B1 * | 8/2002 | Ning et al. | | 438/3 |
| 2007/0259457 A1 * | 11/2007 | DiCarlo | | 438/16 |
| 2008/0194114 A1 * | 8/2008 | Yoshida | | 438/714 |

* cited by examiner

*Primary Examiner* — Hsien Ming Lee
(74) *Attorney, Agent, or Firm* — Kilpatrick Townsend & Stockton LLP

(57) ABSTRACT

A method for fabricating an integrated circuit device includes providing a semiconductor substrate having a first region and a second region, e.g., peripheral region. The method forms a stop layer overlying the first and second regions and a low k dielectric layer (e.g., k<2.9) overlying the stop layer in the first and second regions. The method forms a cap layer overlying the low k dielectric layer. In an embodiment, the method initiates formation of a plurality of via structures within a first portion of the low k dielectric layer overlying the first region and simultaneously initiates formation of an isolated via structure for in the second region of the semiconductor substrate, using one or more etching processes. The method includes ceasing formation of the plurality of via structures within the first portion and ceasing formation of the isolated via structure in the second region when one or more portions of stop layer have been exposed.

19 Claims, 6 Drawing Sheets

VIA CONTACT STRUCTURES AND METHODS FOR INTEGRATED CIRCUITS

CROSS-REFERENCES TO RELATED APPLICATIONS

This application claims priority to Chinese Application No. 200910057964.9; filed Sep. 28, 2009; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and resulting device for via structures for dense and isolated regions of integrated circuits, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of a process that has limitations based upon a given feature size is the formation of contact structures for MOS transistor devices. Such contact structures are often formed for dense array patterns and isolated regions. Unfortunately, it is often difficult to form similar contact structures in an efficient manner in both dense and isolated regions. That is, difficulties arise in making each of these contact structures accurate and reliable as device sizes decrease. These and other limitations of conventional contact structures can be found throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and resulting device for via structures for dense and isolated regions of integrated circuits, but it would be recognized that the invention has a much broader range of applicability.

In a specific embodiment, the present invention provides a method for fabricating an integrated circuit device, e.g., memory, application specific integrated circuit, microprocessor, and system on a chip. The method includes providing a semiconductor substrate, which has a first region and a second region, e.g., peripheral region, scribe region. The method forms a device layer overlying the first region of the semiconductor substrate and forms an inter-metal layer dielectric (e.g., borophosphosilicate glass, fluorinated glass, doped glass) overlying the device layer. The method forms a stop layer overlying the inter-metal layer dielectric in the first region and the second region. The method forms a low k dielectric layer (e.g., k<2.9) overlying the stop layer in the first region and the second region. The method forms a cap layer overlying the low k dielectric layer. In a preferred embodiment, the method initiates formation of a plurality of via structures within a first portion of the low k dielectric layer overlying the first region and simultaneously initiates formation of an isolated via structure for a test structure in the second region of the semiconductor substrate, using one or more etching processes. The method includes ceasing formation of the plurality of via structures within the first portion and ceasing formation of the isolated via structure in the second region when one or more portions of stop layer have been exposed.

In a specific embodiment, the present invention provides a method for fabricating an integrated circuit device, e.g., memory, application specific integrated circuit, microprocessor, and system on a chip. The method includes providing a semiconductor substrate, which has a first region and a second region, e.g., peripheral region, scribe region. The method forms a stop layer overlying the first region and the second region. The method forms a low k dielectric layer (e.g., k<2.9) overlying the stop layer in the first region and the second region. The method forms a cap layer overlying the low k dielectric layer. In a preferred embodiment, the method initiates formation of a plurality of via structures within a first portion of the low k dielectric layer overlying the first region and simultaneously initiates formation of an isolated via structure for in the second region of the semiconductor substrate, using one or more etching processes. The method includes ceasing formation of the plurality of via structures within the first portion and ceasing formation of the isolated via structure in the second region when one or more portions of stop layer have been exposed.

In an alternative specific embodiment, the present invention provides an integrated circuit device. The device has a semiconductor substrate, which has first region and a second region. The integrated circuit device includes a stop layer overlying the first region and the second region and a low k dielectric layer overlying the stop layer in the first region and the second region. The integrated circuit device also includes a cap layer overlying the low k dielectric layer. The integrated circuit device further includes a plurality of via structures within a first portion of the low k dielectric layer overlying the first region and an isolated via structure in the second region of the semiconductor substrate. In a preferred embodiment, the cap layer prevents a punch through of a portion of the stop layer provided in the isolated via structure.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for contact via structures in both dense and isolated regions of the integrated circuit device according to a specific embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
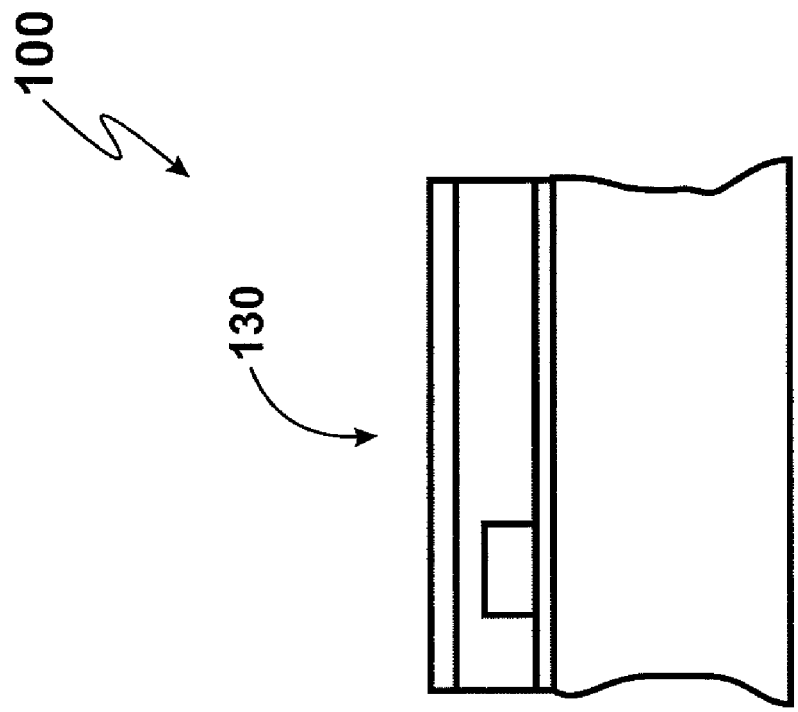
FIGS. 1 through 5 illustrate a method for forming via contact structures for integrated circuits according to embodiments of the present invention.
Figure 1:
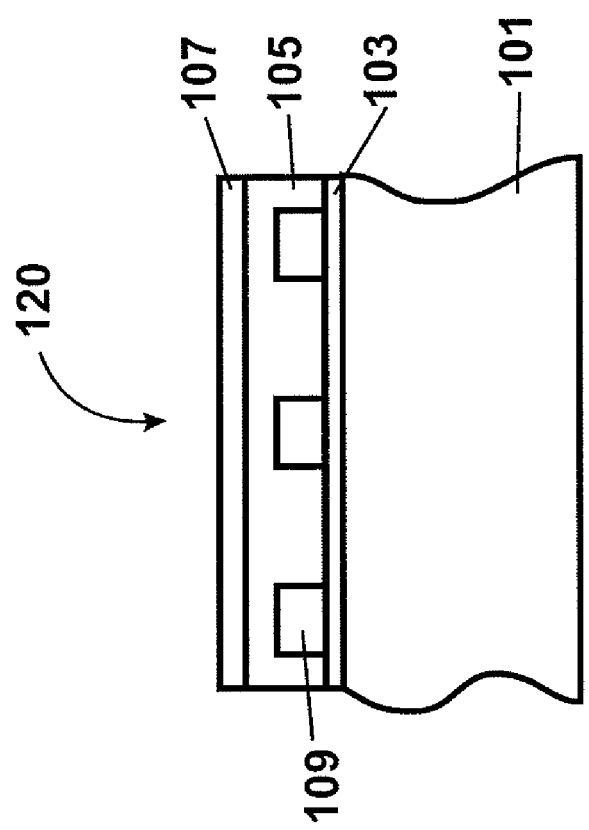

According to the present invention, techniques for processing integrated circuits for the manufacture of semiconductor devices are provided. More particularly, the invention provides a method and resulting device for via structures for dense and isolated regions of integrated circuits, but it would be recognized that the invention has a much broader range of applicability.

A method for manufacturing an integrated circuit device according to an embodiment of the present invention may be outlined as follows.

1. Provide a semiconductor substrate, which has a first region and a second region, e.g., peripheral region, scribe region.
2. Form a device layer (e.g., MOS devices, CMOS devices, BiCMOS devices) overlying the first region of the semiconductor substrate;
3. Form an inter-metal layer dielectric (e.g., borophosphosilicate glass, fluorinated glass, doped glass) overlying the device layer;
4. Form a stop layer overlying the inter-metal layer dielectric in the first region and the second region;
5. Form a low k dielectric layer (e.g., k<2.9) overlying the stop layer in the first region and the second region;
6. Form a cap layer overlying the low k dielectric layer;
7. Initiate formation of a plurality of via structures within a first portion of the low k dielectric layer overlying the first region;
8. Simultaneously initiate formation (with a portion of step 7) of an isolated via structure for a test structure in the second region of the semiconductor substrate, using one or more etching processes;
9. Cease formation of the plurality of via structures within the first portion;
10. Cease formation of the isolated via structure in the second region when one or more portions of stop layer have been exposed;
11. Perform other steps, as desired.

The above sequence of steps provides a method according to an embodiment of the present invention. As shown, the method uses a combination of steps including a way of forming a plurality of via structures and isolated via concurrently according to an embodiment of the present invention. Other alternatives can also be provided where steps are added, one or more steps are removed, or one or more steps are provided in a different sequence without departing from the scope of the claims herein.

An alternative method for manufacturing an integrated circuit device according to an embodiment of the present invention may be outlined as follows.

1. Provide a semiconductor substrate, which has a first region and a second region, e.g., peripheral region, scribe region.
2. Form a device layer (e.g., MOS devices, CMOS devices, BiCMOS devices) overlying the first region of the semiconductor substrate;
3. Form an inter-metal layer dielectric (e.g., borophosphosilicate glass, fluorinated glass, doped glass) overlying the device layer;
4. Form a stop layer overlying the inter-metal layer dielectric in the first region and the second region;
5. Form a low k dielectric layer (e.g., k<2.9) overlying the stop layer in the first region and the second region;
6. Form a cap layer overlying the low k dielectric layer;
7. Simultaneously begin formation of a plurality of via structures within a first portion of the low k dielectric layer overlying the first region and begin formation of an isolated via structure in the second region of the semiconductor substrate, using one or more etching processes;
8. Simultaneously cease formation of the plurality of via structures within the first portion and cease formation of the isolated via structure in the second region when one or more portions of stop layer have been exposed;
9. Perform other steps, as desired.

The above sequence of steps provides a method according to an embodiment of the present invention. As shown, the method uses a combination of steps including a way of forming a plurality of via structures and isolated via concurrently according to an embodiment of the present invention. Other alternatives can also be provided where steps are added, one or more steps are removed, or one or more steps are provided in a different sequence without departing from the scope of the claims herein. Details of the present method and structure can be found throughout the present specification and more particularly below. Details of the present method and structure can be found throughout the present specification and more particularly below.

FIGS. 1 through 5 illustrate a method for forming via contact structures for integrated circuits according to embodiments of the present invention. These diagrams are merely examples, which should not unduly limit the scope of the claims herein. One of ordinary skill in the art would recognize many variations, modifications, and alternatives. As shown, the present method begins by providing a semiconductor substrate 101, e.g., silicon wafer, silicon on insulator, epitaxial silicon. The substrate has at least a first region 120 and a second region 130, e.g., peripheral region, scribe region. In a specific embodiment, the first region can be a cell region or other suitable region. In a specific embodiment, the first region is characterized by a higher density region and the second region is characterized by a lower density region within the semiconductor substrate. Here, the terms "higher" and "lower" do not refer to a specific numerical value but are being recited in terms of ordinary meaning and can be interpreted relative to each other. Of course, there can be other variations, modifications, and alternatives.

In a specific embodiment, the method forms a device layer overlying the first region of the semiconductor substrate. As shown in FIG. 1, the device layer includes a plurality of MOS transistors 109. Each of the transistors include a gate dielectric layer 103, channel region, source region, and drain region. The device layer is often made of suitable processing steps, such as formation of a gate dielectric (e.g., silicon oxide, silicon oxynitride, nitride), formation of gate structures (with sidewall spacers), and implanted source/drain regions. Depending upon the embodiment, the device layer can be a single layer, multiple layers, or the like. Of course, there can be other variations, modifications, and alternatives.

The method forms an inter-metal layer dielectric 105 (e.g., borophosphosilicate glass, fluorinated glass, doped glass) overlying the device layer. As noted, the inter-metal layer dielectric can be formed of any suitable material including oxides, nitrides, or combinations of these materials. The dielectric layer is often planarized using an etch back, chemical mechanical polishing process, or any combination of these, depending upon the embodiment. In a specific embodiment, the method forms a stop layer 107 overlying the planarized dielectric layer. The stop layer can be any suitable material such as aluminum, doped polysilicon, or tungsten. Preferably, the material is copper, which is provided on a tantalum barrier material, according to a specific embodiment. The copper layer is preferably sputtered, plated, and/or deposited, according to a specific embodiment. Depending upon the embodiment, there can be other variations, modifications, and alternatives.

In a specific embodiment, the method forms a stop layer 107 overlying the inter-metal layer dielectric 105 in the first region 120 and the second region 130. In a specific embodiment, the stop layer can be made of any suitable material and/or materials. In a specific embodiment, the stop layer can be a nitrogen doped silicon carbide (NDC) material, oxygen doped silicon carbide, or like materials. In a preferred embodiment, the stop material has a thickness of at least 400 Angstroms and provides suitable characteristics to slow down and/or substantially stop an etching process, which is characterized by a removal of stop material. Of course there can be other variations, modifications, and alternatives.

Figure 2:
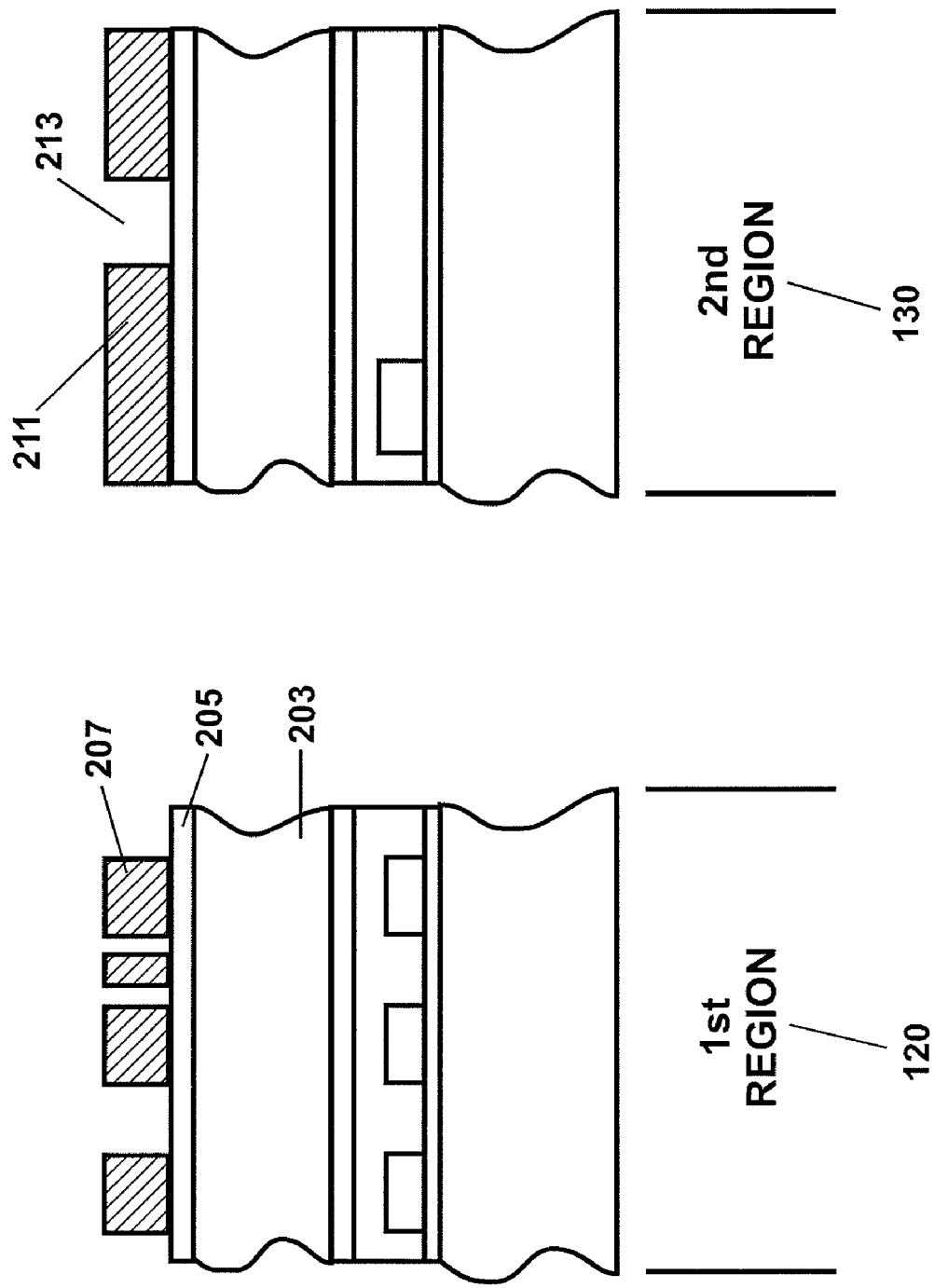

In a specific embodiment, the method forms a low k dielectric layer 203 (e.g., k<2.9) overlying the stop layer in the first region 120 and the second region 130, as illustrated in FIG. 2. In a preferred embodiment, the low k dielectric material is formed using a suitable deposition process. An example of such deposition process can be from companies such as Applied Materials, Inc., as well as other companies. In a specific embodiment, the stop layer and the low k dielectric material are characterized by an etch selectivity of about 10 or greater. Of course, there can be other variations, modifications, and alternatives. As shown in FIG. 2, the method forms a cap layer 205 overlying the low k dielectric layer. In a specific embodiment, the cap layer can be made of any suitable material and/or materials and suitable thickness. As merely an example for a nitrogen doped silicon carbide ("NDC") material, the cap layer has a thickness that depends on a lithography condition and material reflectivity and refractive index according to a specific embodiment. In a preferred embodiment, the cap layer, which is subjected to etching, substantially prevents a punch through of a portion of the stop layer underlying the isolated via structure when patterning occurs. In a specific embodiment, the cap layer can be selected from a silicon nitride, TEOS, doped glass, silicon oxynitride layer, metal material, polysilicon, any combination of these, and others. In a specific embodiment, the cap layer has a thickness of at least 100 Angstrom. Further details of the cap layer can be found throughout the present specification and more particularly below.

In a specific embodiment, the method forms a dense photoresist pattern 207 overlying the first region and a single isolated via structure region 213 and photoresist pattern 211 in the second region according to a preferred embodiment. In a specific embodiment, the dense photoresist pattern often corresponds to a region for an array and/or cell structure. The single isolated via structure corresponds to a test structure and/or other very low density application according to a specific embodiment. Further details of the cap layer can be found throughout the present specification and more particularly below.

In a preferred embodiment, the method initiates formation of a plurality of via structures within a first portion of the low k dielectric layer overlying the first region and simultaneously initiates formation of an isolated via structure for a test structure in the second region of the semiconductor substrate, using one or more etching processes. In a specific embodiment, the formation of the plurality of via structures and the isolated via structure may use a fluorine bearing species in a plasma environment. In other embodiments, the etching processes can be any suitable wet and/or dry processes. As merely an example, the etching process is a reactive ion etching process commonly called RIE dry etching or others. Of course, there can be other variations, modifications, and alternatives.

Figure 3:
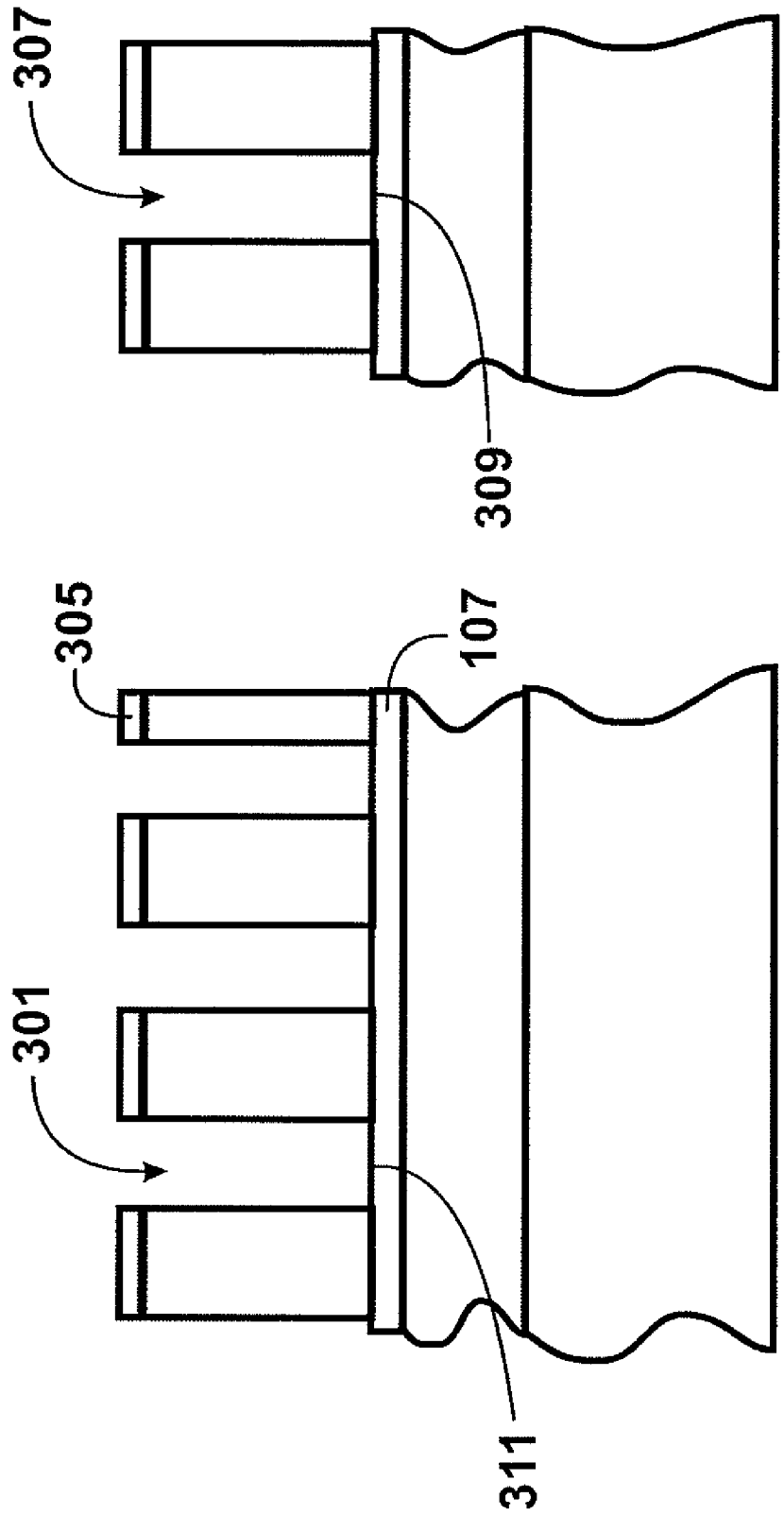

In a specific embodiment, the method includes ceasing formation of the plurality of via structures within the first portion and ceasing formation of the plurality of via structures within the second portion when one or more portions of stop layer have been exposed. Referring to FIG. 3, the method forms a plurality of via structures 301 in the first region and an isolated via structure 307 in the second region according to a specific embodiment. That is, each of these structures is formed without punch through of the isolated via structure, which we call the "Kelvin" via according to our applications.

As also shown, the method stops on the stop layers 311 and 309 in the first and second regions, respectively. The method strips the photoresist layer to expose the cap layer 305, which has been patterned. In a preferred embodiment, the cap layer, which is subjected to etching, substantially prevents a punch through of a portion of the stop layer underlying the isolated via structure. As also shown, the method ceases formation of the via structures after exposing an entirety of respective portions of the etch stop layer provided in the plurality of via structures and the isolated via structure.

Figure 4:
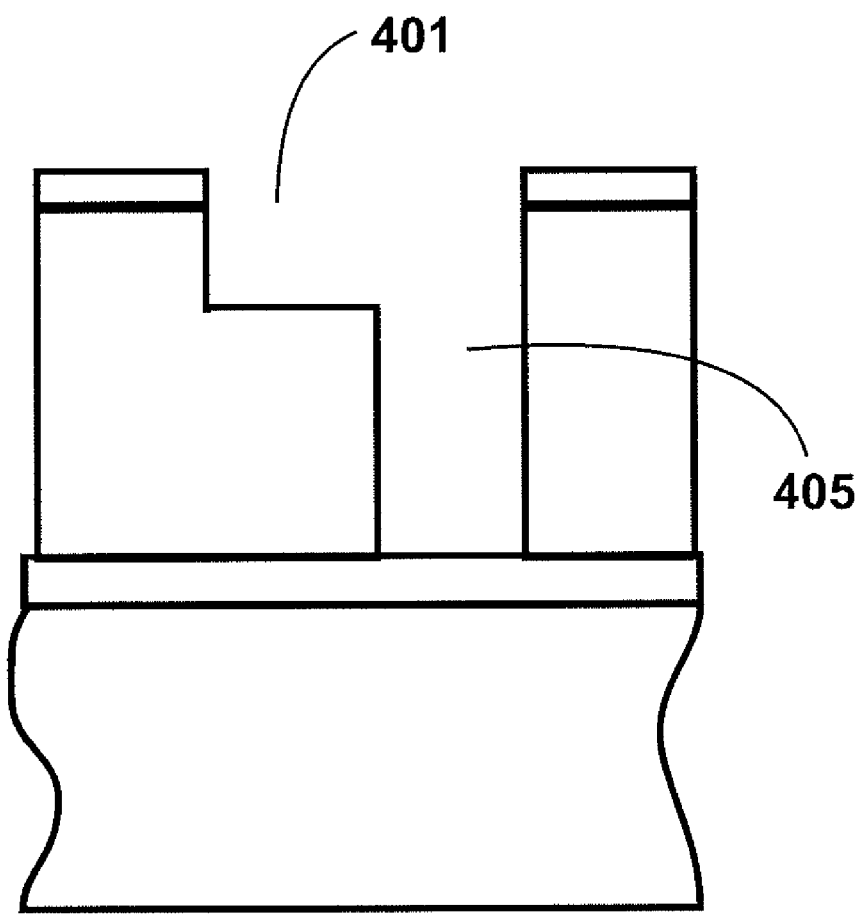

Depending upon the embodiment, the via structures in the first region can be a single structure and/or multiple structures. Referring to FIG. 4, the via structure can also include a first depth 401 and a second depth 405, which are suitable for a dual damascene copper based structure according to a specific embodiment. Of course, there can be variations, modifications, and alternatives.

Figure 5:
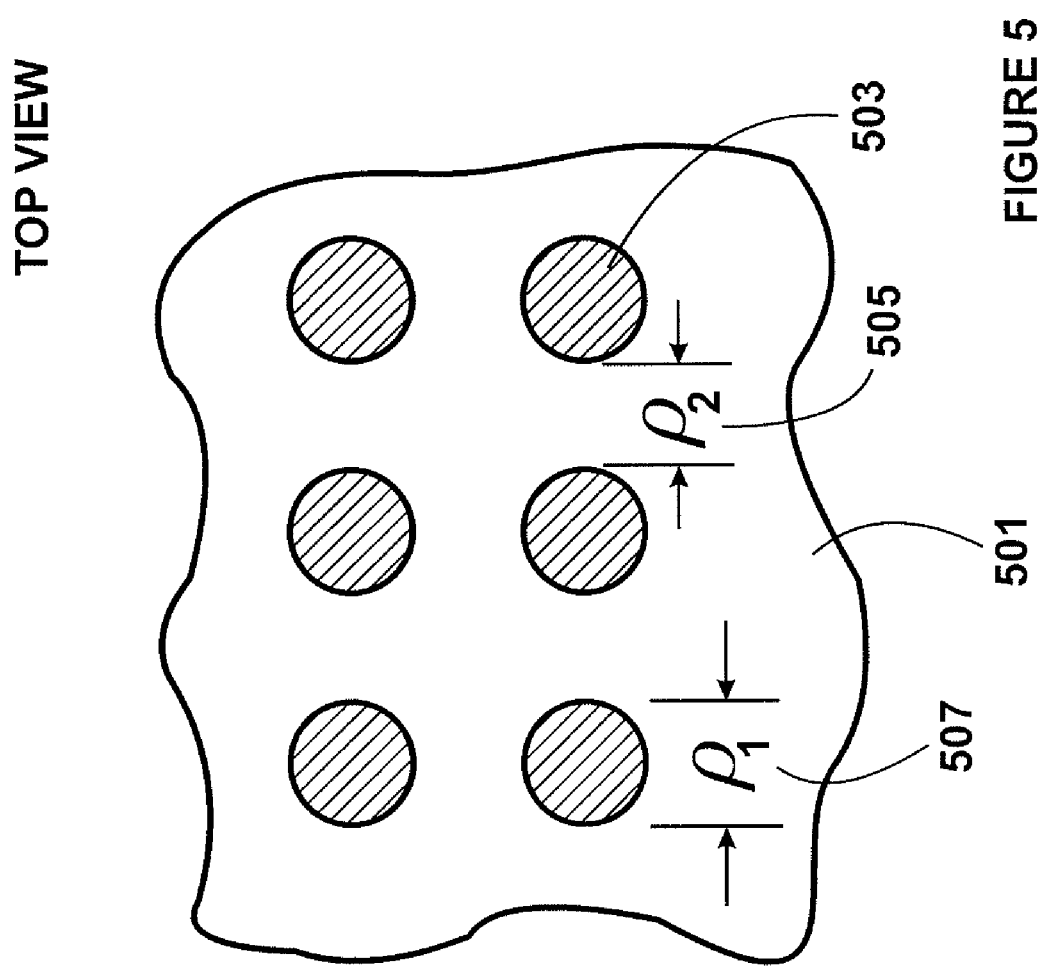

In a preferred embodiment, the first region and the second region include via structures of certain characteristics. Referring to FIG. 5, which is a "top view" diagram of FIG. 3, via structure 503 in the first region, which we call dense region, include a diameter of about $\rho 1$ and a pitch between each of the via structures can be $\rho 2$, which is about the same size (slightly larger or smaller) of $\rho 1$. In a specific embodiment, the isolated via structure 511 also has a diameter of about $\rho 1$. In a specific embodiment, the isolated via structure is substantially free from any via structure in any direction extending about 1 micron and greater from a center region of the isolated via structure. In an embodiment, the isolated via structure is used to evaluate a via structure present in an entire integrated circuit device by measuring electrical resistance of the integrated circuit after formation of the device. The isolated via structure in the second region can also be used to evaluate whether or not the via structures in the first region is reliably formed. It is believed that such isolation leads to uncontrollable etching and punch through of the stop layer without the cap layer according to a specific embodiment. Of course, there can be other variations, modifications, and alternatives.

The above sequence of steps provides a method according to an embodiment of the present invention. As shown, the method uses a combination of steps including a way of forming a plurality of via structures and isolated via concurrently according to an embodiment of the present invention. Other alternatives can also be provided where steps are added, one or more steps are removed, or one or more steps are provided in a different sequence without departing from the scope of the claims herein. Details of the present method and structure can be found throughout the present specification and more particularly below. Experimental details of the present method and structure can be found more particularly below.

Figure 6:
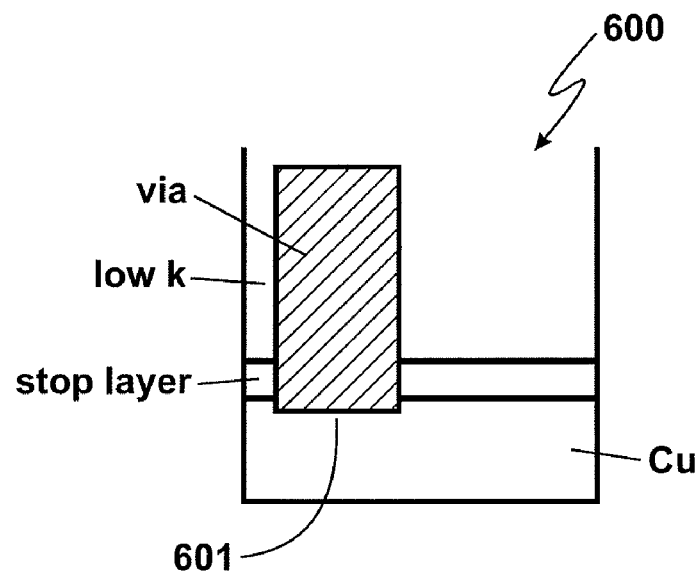
FIGS. 6 and 7 are cross-sections of device structures from experiments performed according to embodiments of the present invention.
Figure 7:
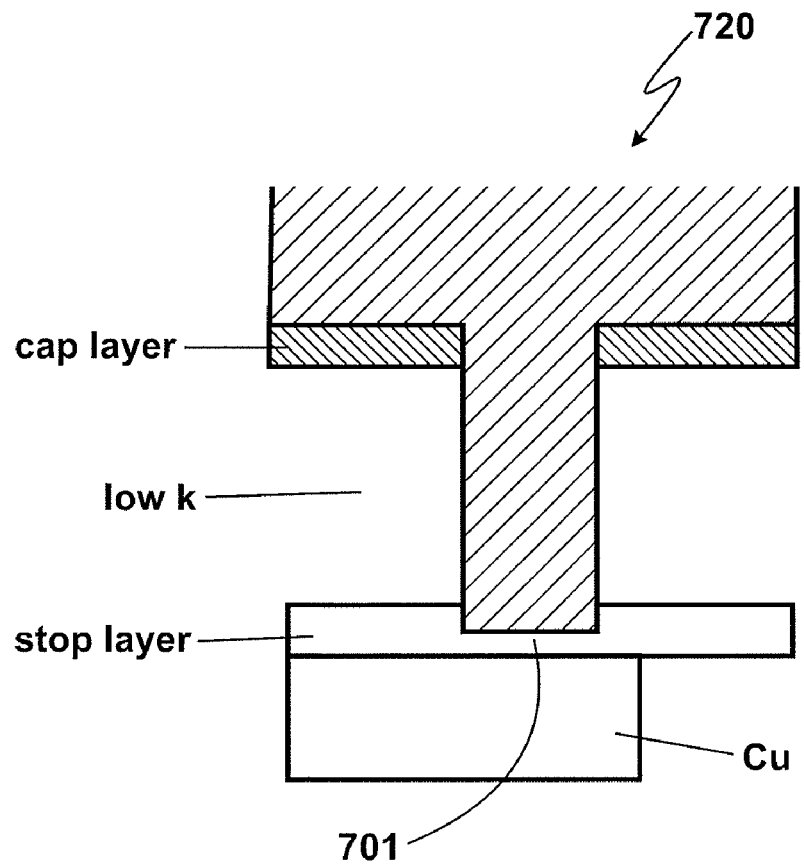

FIGS. 6 and 7 are cross-sections of device structures from experiments performed according to embodiments of the present invention. These diagrams are merely examples, which should not unduly limit the scope of the claims herein. One of ordinary skill in the art would recognize many variations, modifications, and alternatives. As shown, via structure 600 punches through (601) the stop layer to the underlying copper layer when there is no cap layer. Referring to FIG. 7, via structure 720 does not punch through (701) to the underlying copper layer when a cap layer is added overlying the low k material, as illustrated. In via structure 720, we used a stop layer made of an NDC material, as an example, which has a thickness of 500 Angstroms, but can be others. The interlayer dielectric material was low k and called Black Diamond™ manufactured by Applied Materials, Inc. of Santa Clara, Calif., USA, but can be others. The cap layer was NDC material, which had a thickness of at least 100 Angstroms. Etching occurred using carbon fluoride based species in a plasma environment, but can be others. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated circuit device, the method comprising:
    providing a semiconductor substrate, the substrate comprising a first region and a second region;
    forming a device layer overlying the first region of the semiconductor substrate;
    forming an inter-metal layer dielectric overlying the device layer;
    forming a stop layer overlying the inter-metal layer dielectric in the first region and the second region;
    forming a low k dielectric layer overlying the stop layer in the first region and the second region;
    forming a cap layer overlying the low k dielectric layer;
    initiating formation of a plurality of via structures within a first portion of the low k dielectric layer overlying the first region and simultaneously initiating formation of an isolated via structure for a test structure in the second region of the semiconductor substrate, using an etching process; and
    ceasing formation of the plurality of via structures within the first portion and ceasing formation of the isolated via structure in the second region when a portion of the stop layer has been exposed;
    wherein the first region is a cell region and the second region is a peripheral region.

2. The method of claim 1 wherein the peripheral region is a scribe region.

3. The method of claim 1 wherein a via density in the first region is higher than a via density in the second region.

4. The method of claim 1 wherein the stop layer comprises a nitrogen doped silicon carbide (NDC) material.

5. The method of claim 1 wherein the stop layer comprises an oxygen doped silicon carbide material.

6. The method of claim 1 wherein the stop layer and the low k dielectric material are characterized by an etch selectivity of about 10.

7. The method of claim 1 wherein the test structure comprises a resistance test structure.

8. The method of claim 1 wherein a pitch between two adjacent via structures has a dimension about the diameter of a via structure.

9. The method of claim 1 wherein the isolated via structure is substantially free from any via structure in any direction extending from about 1 micron to about 5 microns from a center region of the isolated via structure.

10. The method of claim 1 wherein the initiating formation of the via structures and the isolated via structure comprises using a fluorine bearing species in a plasma environment.

11. The method of claim 1 wherein the stop layer has a thickness of at least 400 Angstroms.

12. The method of claim 1 wherein the cap layer has a thickness of at least 100 Angstroms.

13. The method of claim 1 wherein the cap layer has a thickness of less than 500 Angstroms.

14. The method of claim 1 wherein a portion of the cap layer substantially prevents a punch through of a portion of the stop layer underlying the isolated via structure.

15. The method of claim 1 wherein the cap layer can be selected from a group consisting of silicon nitride, TEOS, doped glass, silicon oxynitride layer, metal, and polysilicon.

16. The method of claim 1 further comprising forming a copper interconnect layer overlying the inter-metal layer dielectric.

17. The method of claim 1 wherein the ceasing formation of the via structures and the ceasing formation of the isolated via occur after exposing an entirety of respective portions of the stop layer provided in the plurality of via structures and the isolated via structure.

18. A method for fabricating an integrated circuit device, the method comprising:
    providing a semiconductor substrate, the substrate comprising a first region and a second region;
    forming a stop layer overlying the first region and the second region;
    forming a low k dielectric layer overlying the stop layer in the first region and the second region;
    forming a cap layer overlying the low k dielectric layer;
    simultaneously initiating formation of a plurality of via structures within a first portion of the low k dielectric layer overlying the first region and initiating formation of an isolated via structure in the second region of the semiconductor substrate, using one or more etching processes; and
    simultaneously ceasing formation of the plurality of via structures within the first portion and ceasing formation of the isolated via structure in the second region when a portion of the stop layer has been exposed;
    whereupon the cap layer prevents a punch through of a portion of the stop layer provided in the isolated via structure.

19. An integrated circuit device comprising:

a semiconductor substrate, the substrate comprising a first region and a second region;

a stop layer overlying the first region and the second region;

a low k dielectric layer overlying the stop layer in the first region and the second region;

a cap layer overlying the low k dielectric layer;

a plurality of via structures within a first portion of the low k dielectric layer overlying the first region; and an isolated via structure in the second region of the semiconductor substrate;

whereupon the cap layer prevents a punch through of a portion of the stop layer provided in the isolated via structure.

* * * * *